United States Patent
Aga

(10) Patent No.: US 9,953,860 B2
(45) Date of Patent: Apr. 24, 2018

(54) METHOD OF MANUFACTURING SOI WAFER

(71) Applicant: SHIN-ETSU HANDOTAI CO., LTD., Tokyo (JP)

(72) Inventor: Hiroji Aga, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 15/313,473

(22) PCT Filed: Apr. 13, 2015

(86) PCT No.: PCT/JP2015/002042
§ 371 (c)(1),
(2) Date: Nov. 22, 2016

(87) PCT Pub. No.: WO2015/194079
PCT Pub. Date: Dec. 23, 2015

(65) Prior Publication Data
US 2017/0200634 A1  Jul. 13, 2017

(30) Foreign Application Priority Data
Jun. 17, 2014  (JP) .................... 2014-124046

(51) Int. Cl.
*H01L 21/762* (2006.01)
*H01L 27/12* (2006.01)
(Continued)

(52) U.S. Cl.
CPC .... *H01L 21/76254* (2013.01); *H01L 21/0206* (2013.01); *H01L 21/02233* (2013.01);
(Continued)

(58) Field of Classification Search
CPC ........... H01L 21/76254; H01L 21/0206; H01L 21/02233; H01L 21/84; H01L 22/26; H01L 27/12
See application file for complete search history.

(56) References Cited

U.S. PATENT DOCUMENTS

2001/0014544 A1  8/2001  Tanaka et al.
2003/0181001 A1  9/2003  Aga et al.
(Continued)

FOREIGN PATENT DOCUMENTS

EP  1840956 A1  10/2007
JP  2000-031071 A  1/2000
(Continued)

OTHER PUBLICATIONS

Jul. 14, 2015 International Search Report issued in International Patent Application No. PCT/JP2015/002042.
(Continued)

*Primary Examiner* — Bilkis Jahan
*Assistant Examiner* — Victor Barzykin
(74) *Attorney, Agent, or Firm* — Oliff PLC

(57) ABSTRACT

A method of manufacturing an SOI wafer, including (a) forming a thermal oxide film on an SOI layer of an SOI wafer by a heat treatment under an oxidizing gas atmosphere, (b) measuring thickness of the SOI layer after forming the thermal oxide film, (c) performing a batch cleaning, wherein an etching amount of SOI layer is adjusted depending on thickness of the SOI layer measured in step (b) such that thickness of the SOI layer is adjusted to be thicker than a target value after etching, (d) measuring thickness of the SOI layer after batch cleaning, (e) performing a single-wafer cleaning, wherein an etching amount of the SOI layer is adjusted depending on thickness of the SOI layer measured in step (d) such that thickness of the SOI layer is
(Continued)

adjusted to be the target value after etching, and removing the thermal oxide film formed in step (a) before or after step (b).

16 Claims, 4 Drawing Sheets

(51) Int. Cl.
  *H01L 21/84* (2006.01)
  *H01L 21/66* (2006.01)
  *H01L 21/02* (2006.01)

(52) U.S. Cl.
  CPC .............. *H01L 21/84* (2013.01); *H01L 22/26* (2013.01); *H01L 27/12* (2013.01)

(56) References Cited

U.S. PATENT DOCUMENTS

2007/0224778 A1* 9/2007 Murakami ........ H01L 21/76243
  438/459

2009/0057811 A1* 3/2009 Murakami ........ H01L 21/02052
  257/506

FOREIGN PATENT DOCUMENTS

| JP | 2004-349493 A | 12/2004 |
| JP | 2007-266059 A | 10/2007 |
| JP | 2009-054837 A | 3/2009 |
| JP | 2010-092909 A | 4/2010 |
| TW | 200802695 A | 1/2008 |
| TW | 200933733 A | 8/2009 |

OTHER PUBLICATIONS

Nov. 8, 2016 Office Action issued in Japanese Patent Application No. 2014-124046.
Dec. 20, 2016 International Preliminary Report on Patentability issued in International Patent Application No. PCT/JP2015/002042.
Mar. 23, 2017 Office Action issued in Taiwanese Patent Application No. 104112236.
Jan. 26, 2018 extended European Search Report issued in Application No. 15809306.2.

* cited by examiner

METHOD OF MANUFACTURING SOI WAFER

TECHNICAL FIELD

The present invention relates to a method of manufacturing an SOI wafer, and more particularly to a method of manufacturing an SOI wafer that requires extremely high uniformity of SOI layer thickness, called Fully Depleted Silicon-On-Insulator (FDSOI).

BACKGROUND ART

One of conventional methods for thinning an SOI layer is to subject an SOI wafer to heat treatment with a batch heat treatment furnace, change silicon on the SOI surface into an oxide film by oxidation, and then remove the oxide film.

This method requires precisely controlling the thickness of the oxide film to be an aimed value in order to accurately reduce SOI film thickness (the thickness of the SOI layer) to an intended value (a target value). However, it is very difficult to precisely control the thickness of an actual oxide film, which is grown by heat treatment, since the oxidation rate is changed depending on variation of pressure during oxidation. Thus, when oxidation is used for thinning, the following method has been employed: the layer is thinned by oxidation such that the SOI film thickness after thinning is slightly thicker than an intended value, and then the layer is further thinned by etching for a controlled etching period such that the intended value is achieved.

This two-step thinning method has been implemented by, for example, removing the oxide film after oxidation, then measuring the thickness of the SOI layer, and determining a stock removal in the subsequent etching step on the basis of the measured value, as disclosed in PATENT LITERATURE 1.

There is also proposed a method that shortens the steps in the above two-step thinning method including oxidation and etching, by measuring the thickness of the SOI layer while the oxide film remains after oxidation, and performing oxide film removal, etching, and cleaning steps in one batch process, on the basis of the measured SOI value (PATENT LITERATURE 2).

CITATION LIST

Patent Literature

PATENT LITERATURE 1: Japanese Patent Laid-Open Publication No. 2007-266059
PATENT LITERATURE 2: Japanese Patent Laid-Open Publication No. 2010-92909

SUMMARY OF INVENTION

Technical Problem

However, these methods are insufficient to precisely control the thickness of the SOI layer and cause a variation of oxide film thickness by heat treatment such as a batch type of heat treatment and a variation of stock removal (a variation of etching amount of the SOI layer) by etching (cleaning such as batch cleaning); these variations lead to a variation of film thickness (a variation of SOI film thickness) on multiple SOI wafers processed in the same batch.

FIG. 5 shows a relationship between a slot position in a cleaning cassette and an in-plane average stock removal of an SOI layer (Si) when 25 SOI wafers were cleaned (etched) with an SC1 cleaning solution (a mixed aqueous solution containing ammonia water and hydrogen peroxide water) in one batch such that each SOI layer was thinned by about 14.5 nm. The figure shows that the variation of stock removal in a batch is 0.61 nm in terms of a peak-to-valley (P-V) value, which is obtained by subtracting the minimum from the maximum.

FIG. 6 shows a relationship between a position in a furnace and (in-plane average) thickness of an oxide film formed when 100 SOI wafers were thermally oxidized with a batch heat treatment furnace in one batch.

The variation of in-plane average film thickness caused by the batch heat treatment as shown in FIG. 6 cannot be controlled and corrected when the SOI layer is etched only by batch cleaning as shown in FIG. 5. In particular, although FDSOI wafers require highly precise film-thickness uniformity, for example, controlling the variation of SOI film thickness within a target value±0.5 nm at every points (at every measurement points over the entire wafer), this requirement cannot be met by batch cleaning alone. In addition, since an adjustment stock removal (a stock removal of etching) to obtain the target value after oxidation, i.e., a stock removal for adjusting the film thickness in a final step is large, deviation from the target value tends to increase.

By contrast, when the SOI film thickness is adjusted with a single-wafer cleaning apparatus (for example, a spin cleaning apparatus as shown in FIG. 2 of Japanese Patent Laid-Open Publication No. 2000-31071), the variation of film thickness in a batch can be corrected among wafers. However, this type of apparatus causes a larger variation of stock removal in a wafer plane than does the batch cleaning apparatus for reasons, for example, that a chemical solution is heated at a chemical solution nozzle. Thus, if the film thickness is adjusted only by single-wafer cleaning (etching), film thickness range (P-V value) in the wafer plane is degraded, and the requirement of ±0.5 nm or less at every measurement points cannot be satisfied. In addition, since the stock removal for adjusting the film thickness in a final step to obtain the target value after oxidation is large like the batch cleaning apparatus, deviation from the target value also tends to increase.

FIG. 7 is a diagram showing comparison results of in-plane average SC1 stock removal and in-plane stock removal range (P-V value) when multiple SOI wafers were cleaned with SC1 by a batch cleaning apparatus alone or a single-wafer cleaning apparatus alone. As shown in FIG. 7, in-plane stock removal range of the single-wafer cleaning apparatus is larger than that of the batch cleaning apparatus. In addition, the single-wafer cleaning apparatus tends to increase the stock removal range with an increase in SC1 stock removal.

The present invention was accomplished in view of the above-described problems, and has an object to provide a method of manufacturing an SOI wafer that can manufacture SOI wafers excellent in film-thickness uniformity of their SOL layer.

Solution to Problem

To solve the above-mentioned problems, the present invention provides a method of manufacturing an SOI wafer, including reducing a thickness of an SOI layer formed on an insulator layer of an SOI wafer to a predetermined thickness such that the thickness of the SOI layer becomes a target value, the method comprising at least the steps of:

(a) forming a thermal oxide film on the SOI layer by a heat treatment under an oxidizing gas atmosphere;

(b) measuring the thickness of the SOI layer after forming the thermal oxide film;

(c) performing batch cleaning which includes immersing the SOI layer in a cleaning solution having an etching property with respect to the SOI layer, wherein an etching amount of the SOI layer is adjusted depending on the thickness of the SOI layer measured in the step (b) such that the thickness of the SOI layer is adjusted to be thicker than the target value after etching by the batch cleaning;

(d) measuring the thickness of the SOI layer after the batch cleaning; and (e) performing single-wafer cleaning which includes immersing the SOI layer in a cleaning solution having an etching property with respect to the SOI layer, wherein an etching amount of the SOI layer is adjusted depending on the thickness of the SOI layer measured in the step (d) such that the thickness of the SOI layer is adjusted to be the target value after etching by the single-wafer cleaning, the method further comprising removing the thermal oxide film formed in the step (a) after the step (a) and before the step (b), or after the step (b) and before the step (c).

Such a method of manufacturing an SOI wafer can adjust the thickness of the SOI layer by the batch cleaning and the single-wafer cleaning and thus control the variation of SOI film thickness in a batch due to film thickness adjustment by the batch cleaning and the variation of film thickness in a plane due to film thickness adjustment by the single-wafer cleaning. In this manner, SOI wafers excellent in film-thickness uniformity of the SOI layer can be manufactured.

It is preferred that the thickness be measured in the step (b) without removing the thermal oxide film formed in the step (a), the thermal oxide film formed in the step (a) be removed by batch cleaning with a HF-containing aqueous solution after the step (b) and before the step (c), and the batch cleaning in the step (c) be performed by immersing the SOI layer in the cleaning solution having the etching property with respect to the SOI layer without drying a surface of the SOI layer after removing the thermal oxide film.

Such a method of manufacturing an SOT wafer can precisely control the thickness of the SOI layer even when the process of thinning the SOI layer is shortened. Thus, the entire cost for the process of thinning the SOI layer can be reduced without decreasing accuracy of the thickness of the SOI layer.

The SOI wafer is preferably produced by an ion implantation delamination method which includes at least the steps of: bonding a bond wafer having a micro bubble layer formed by implanting ions and a base wafer serving as a supporting substrate; and delaminating the bond wafer along the micro bubble layer to form a thin film on the base wafer.

In this manner, the inventive method of manufacturing an SOI wafer can be suitably employed when the SOI wafer to be thinned is produced by the ion implantation delamination method.

The batch cleaning and the single-wafer cleaning preferably include immersion in an SC1 solution.

In this manner, the thickness of the SOI layer can be more precisely controlled by immersion in an SC1 solution.

A batch average of the thickness of the SOI layer after the batch cleaning in the step (c) is preferably controlled to be a value between the target value and the target value+0.5 nm.

Such a method of manufacturing an SOI wafer can minimize a stock removal of etching by the single-wafer cleaning and thus minimize the variation of SOI film thickness in a plane. In addition, this method can adjust the film thickness by the single-wafer cleaning and thus correct the variation of film thickness in a batch caused by the batch cleaning.

Advantageous Effects of Invention

The inventive method of manufacturing an SOI wafer can reduce the stock removal of etching by the single-wafer cleaning and thus minimize the variation of SOI film thickness in a plane. In addition, this method can adjust the film thickness by the single-wafer cleaning and thus correct the variation of film thickness in a batch caused by the batch cleaning. Moreover, the method performs the batch cleaning followed by the single-wafer cleaning to adjust the thickness of the SOI layer in stages. This allows reduction in the stock removal for adjusting the film thickness in the final step, compared with the conventional method. In this manner, the film thickness can be precisely controlled to be the target value. In particular, the present invention can stably manufacture FDSOI wafers, which require highly precise film-thickness uniformity (within the target value±0.5 nm at every points).

DESCRIPTION OF EMBODIMENTS

Hereinafter, the present invention will be described in detail.

As mentioned above, there is demanded a method of manufacturing an SOI wafer that can manufacture SOI wafers excellent in film-thickness uniformity of their SOI layer.

The present inventor keenly conducted studies to achieve the object, and consequently found that the above problems can be solved by a method of manufacturing an SOI wafer that includes adjusting the SOI film thickness to be slightly thicker than a target value (for example, the target value+0 to +0.5 nm or less) by cleaning (for example, HF cleaning+SC1 cleaning) an SOI wafer in a batch manner after forming an thermal oxide film by heat treatment, and then adjusting the final film thickness to be the target value by single-wafer cleaning for etching, thereby bringing the present invention to completion.

Hereinafter, embodiments of the present invention will be described in detail with reference to the drawings, but the present invention is not limited thereto.

Figure 1:
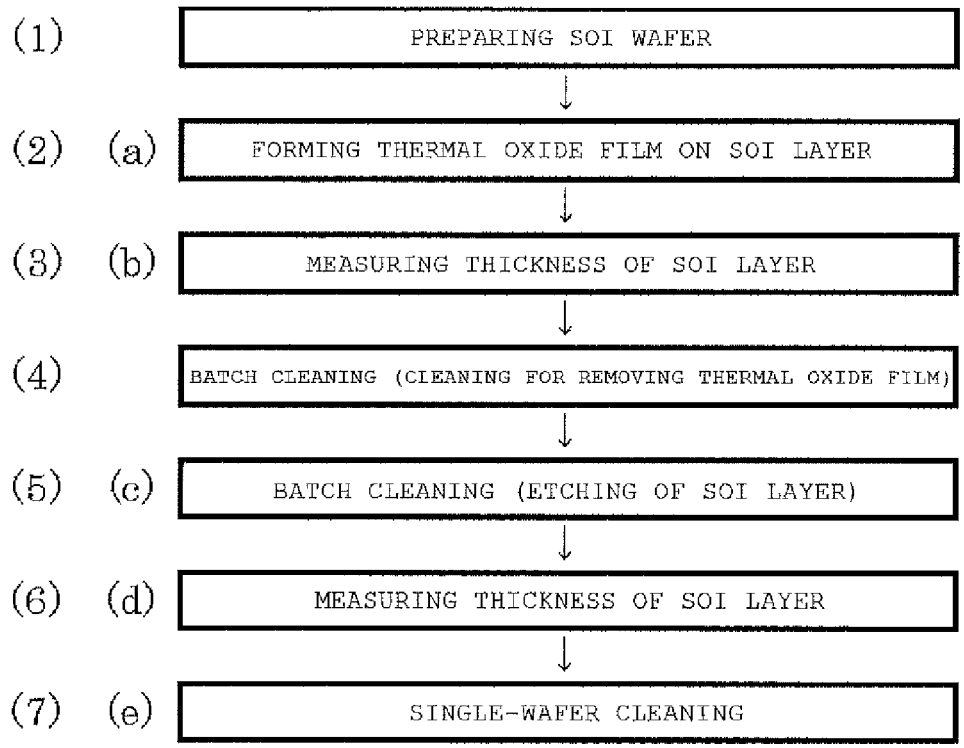
FIG. 1 is a flow chart showing an example of the inventive method of manufacturing an SOI wafer.
Figure 2:
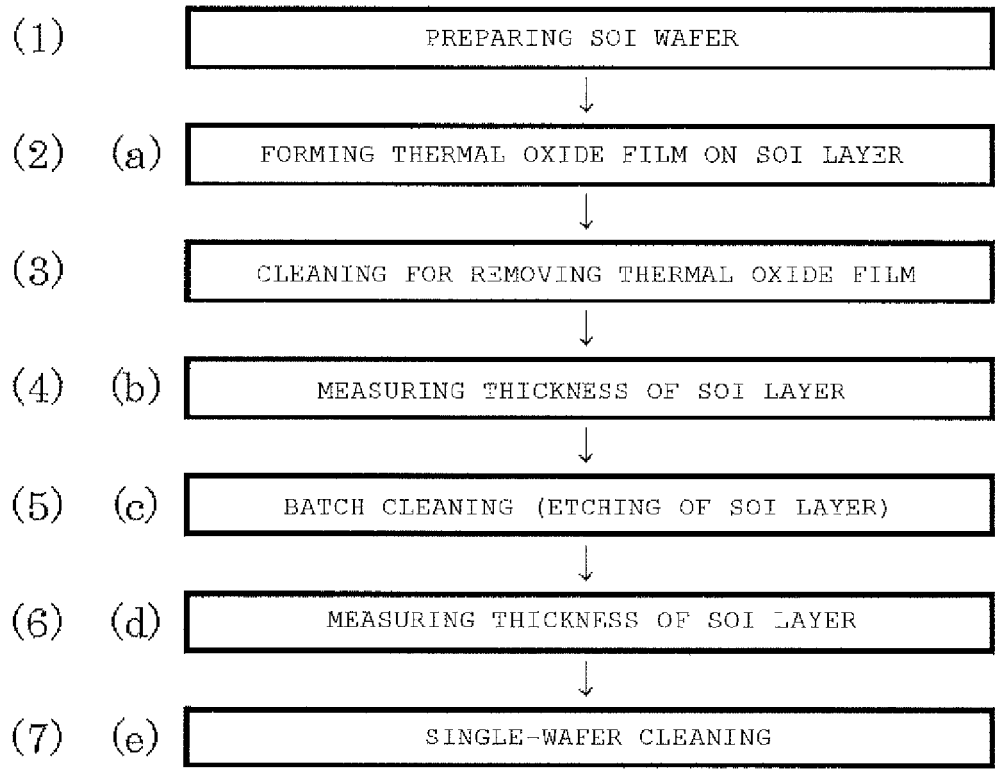
FIG. 2 is a flow chart showing another example of the inventive method of manufacturing an SOI wafer.

FIGS. 1 and 2 are flow charts showing examples of the inventive method of manufacturing an SOI wafer.

First, as shown in FIG. 1(1) and FIG. 2(1), an SOI wafer having an SOI layer formed on an insulator layer is prepared.

The SOI wafer to be prepared is any wafer that at least has an SOI structure in which an SOI layer is formed on an insulator layer. Examples thereof include a wafer having an insulator layer (a buried insulator layer) formed on a supporting layer such as a single crystal silicon and an SOI layer formed on the buried insulator layer.

Herein, an SOI layer means a "silicon on insulator" layer.

A method of producing the SOI wafer is not particularly limited. For example, the SOI wafer to be prepared is preferably produced by an ion implantation delamination method which includes the steps of: bonding a bond wafer having a micro bubble layer formed by implanting ions and a base wafer serving as a supporting substrate via an insulator film; and delaminating the bond wafer along the micro bubble layer to form a thin film on the base wafer.

The present invention can be applied regardless of the SOI wafer producing method, such as the above ion implantation delamination method (so-called Smart Cut method (registered trademark)), rT-CCP (room temperature controlled cleave process, also referred to as SiGen method), and SIMOX method (Separation by Implanted Oxygen method).

Then, as shown in FIG. 1(2) and FIG. 2(2), a thermal oxide film is formed on the SOI layer by a heat treatment under an oxidizing gas atmosphere (Step (a)). This thermal oxide film is obtained by changing silicon near the surface of the SOI layer into an oxide film by oxidation. Examples of the oxidizing gas atmosphere include a pyrogenic atmosphere.

Then, as shown in FIG. 1(3) and FIG. 2(4), the thickness of the SOI layer after forming the thermal oxide film is measured (Step (b)). The thickness of the SOI layer is preferably measured by an ellipsometer, which is capable of precisely measuring the thickness of an SOI layer, although the measurement method is not particularly limited thereto.

In the present invention, the thermal oxide film formed in the step (a) may be removed after the step (a) and before the step (b) as shown in FIG. 2(3), or after the step (b) and before a later-described step (c) as shown in FIG. 1(4). The thermal oxide film can be removed with a HF-containing aqueous solution.

For example, as shown in FIG. 2(3), cleaning for removing the thermal oxide film may be performed before the step (b). In this case, the thickness of the SOI layer may be measured after removing the thermal oxide film and drying the SOI wafer.

Alternatively, as shown in FIG. 1, the film thickness may be measured in the step (b) without removing the thermal oxide film formed in the step (a). This allows the surface of the SOI layer to be protected during measurement and reduces risk such as scratches and impurities, thus improving final quality and yield of SOI wafers.

The thickness of the SOI layer measured at this time does not include the thickness of the thermal oxide film on its surface. In this context, the thermal oxide film formed in the step (a) may be removed after the step (b) and before the step (c). In particular, as shown in FIG. 1(4), batch cleaning for removal with a HF-containing aqueous solution enables removal of the thermal oxide film and etching of the SOI layer in the later-described step (c) to be successively performed.

Then, as shown in FIG. 1(5) and FIG. 2(5), batch cleaning which includes immersing the SOI layer in a cleaning solution having an etching property with respect to the SOI layer is performed (Step (c)). In this step, an etching amount of the SOI layer is adjusted depending on the thickness of the SOI layer measured in the step (b) such that the thickness of the SOI layer is adjusted to be thicker than the target value after etching by the batch cleaning. The adjustment may include controlling an etching period, and changing conditions of the composition and temperature of the cleaning solution.

In the step (c), the thickness of the SOI layer after etching is adjusted to be thicker than the target value. For example, a batch average of the thickness of the SOI layer after the batch cleaning in the step (c) is preferably controlled to be a value between the target value and the target value+0.5 nm. This method can minimize a stock removal of etching by single-wafer cleaning, which is a subsequent step, and thus minimize the variation of SOI film thickness in a plane. In addition, this method can adjust the film thickness of each wafer by the single-wafer cleaning and thus correct the variation of film thickness in a batch. Moreover, since the stock removal for adjusting the film thickness in the final step is reduced compared with the conventional method, the film thickness can be precisely controlled to be the target value. Herein, the batch average means an average thickness of SOI layers of multiple SOI wafers that are cleaned in one batch.

Examples of the cleaning solution having an etching property with respect to the SOI layer include an SC1 solution (a mixed aqueous solution containing ammonia water and hydrogen peroxide water).

If the thermal oxide film is removed in the manner shown in FIG. 1(4), the batch cleaning in the step (c) is preferably performed by immersing the SOI layer in the cleaning solution having an etching property with respect to the SOI layer without drying the surface of the SOI layer after removing the thermal oxide film. In other words, removal of the thermal oxide film and etching of the SOI layer is preferably performed in a successive process. This method can shorten the entire process of thinning the SOI layer, thus reducing the process cost.

Then, as shown in FIG. 1(6) and FIG. 2(6), the thickness of the SOI layer after the batch cleaning is measured (Step (d)). The thickness of the SOI layer can be measured by an ellipsometer.

Then, as shown in FIG. 1(7) and FIG. 2(7), single-wafer cleaning which includes immersing the SOI layer in a cleaning solution having an etching property with respect to the SOI layer is performed (Step (e)). In this step, an etching amount of the SOI layer is adjusted depending on the thickness of the SOI layer measured in the step (d) such that the thickness of the SOI layer is adjusted to be the target value after etching by the single-wafer cleaning. The adjustment may include controlling an etching period, and changing conditions of the composition and temperature of the cleaning solution. In particular, the etching period and the like are preferably controlled for each SOI wafer to reduce the variation of SOI film thickness in a batch caused by the step (c).

As described above, the cleaning solution may be an SC1 solution. When the batch cleaning in the step (c) and the single-wafer cleaning in the step (e) include immersion in an SC1 solution, the thickness of the SOI layer can be more precisely controlled. In these cleaning processes, although it is enough to immerse at least the SOI layer alone in the cleaning solution, the entire SOI wafer may be immersed.

In this manner, performing the batch cleaning followed by the single-wafer cleaning to adjust the thickness of the SOI layer in stages allows reduction in the stock removal for adjusting the film thickness in the single-wafer cleaning. The film thickness can be thus precisely controlled to be the target value.

The method of manufacturing an SOI wafer including the above steps, which combines the batch cleaning and the single-wafer cleaning, can control and correct the variation of in-plane average film thickness of the SOI layer derived from the variation of oxide film thickness caused by a batch type of heat treatment or the like. In particular, when the single-wafer cleaning is performed after the batch cleaning, the etching amount of the SOI layer by the single-wafer cleaning can be reduced. This allows reduction in variation of in-plane stock removal, improving film thickness range (P-V value) in the wafer plane. Thus, the present invention can control the variation of SOI film thickness in a batch due to film thickness adjustment by the batch cleaning and the variation of film thickness in a plane due to film thickness adjustment by the single-wafer cleaning. In particular, the invention enables stable manufacture of FDSOI wafers, which require highly precise film-thickness uniformity (within the target value±0.5 nm at every points).

EXAMPLES

In the following, the present invention will be specifically described with reference to Example and Comparative Examples, but the present invention is not limited to these Examples.

Example

46 SOI wafers (SOI film thickness: 150 nm) having a diameter of 300 mm produced by the ion implantation delamination method were prepared. These wafers were separated into two cleaning cassettes (cassette-01, 02) of a batch type and subjected to the inventive method, as shown in Table 1.

More specifically, first, the SOI wafers were subjected to heat treatment at 950° C. for 2 hours under a pyrogenic atmosphere to form a thermal oxide film on each SOI layer (Step (a)). Then, the thickness of the SOI layer after forming the thermal oxide film was measured by an ellipsometer (Step (b)). At this time, the thickness of the oxide film on the surface was simultaneously measured with the SOI film thickness measurement. Then, batch cleaning was performed with a 15% HF-containing aqueous solution for 100 seconds to remove the thermal oxide film. The SOI layer was then immersed in an SC1 solution by batch cleaning without drying the surface of the SOI layer to adjust the thickness of the SOI layer to be thicker than a target value (Step (c)). The SC1 conditions (composition and temperature) were as follows: $NH_4OH:H_2O_2:H_2O=1:1:5$, liquid temperature was 76° C. The cleaning time was 140 seconds, taking the thickness of the SOI layer measured in the step (b) into consideration.

Then, the thickness of the SOI layer after the batch cleaning was measured by an ellipsometer (Step (d)). At this time, an average SOI film thickness in a batch was also calculated. Then, the SOI layer was immersed in an SC1 solution by single-wafer cleaning (SC1 cleaning by a spin cleaning apparatus) to adjust the thickness of the SOI layer to be the target value (Step (e)). The SC1 conditions (composition and temperature) were the same as above. The cleaning time was 20 to 60 seconds for each SOI wafer, taking the thickness of the SOI layer measured in the step (d) into consideration.

Comparative Example 1

In Comparative Example 1, removal of the oxide film after oxidation and cleaning for adjusting the film thickness were performed only by a batch cleaning apparatus. The cleaning for removing the oxide film and the batch cleaning for adjusting the film thickness in Comparative Example 1 were performed on 22 wafers simultaneously oxidized, with the same cassette (cassette-01) in one batch. More specifically, first, the step (b) and previous steps were performed as in Example. Then, batch cleaning was performed with a 15% HF-containing aqueous solution for 100 seconds to remove the thermal oxide film. The SOI layer was then immersed in an SC1 solution by batch cleaning for 180 seconds without drying the surface of the SOI layer. The SC1 conditions (composition and temperature) were the same as in Example.

Comparative Example 2

In Comparative Example 2, removal of the oxide film after oxidation and cleaning for adjusting the film thickness were performed only by a single-wafer cleaning apparatus. More specifically, first, the step (b) and previous steps were performed as in Example. Then, $SiO_2$ (the thermal oxide film) was removed. Then, the SOI layer of each SOI wafer was immersed in an SC1 solution for 160 to 200 seconds by single-wafer cleaning (SC1 cleaning by a spin cleaning apparatus). The SC1 conditions (composition and temperature) were the same as in Example.

Figure 3:
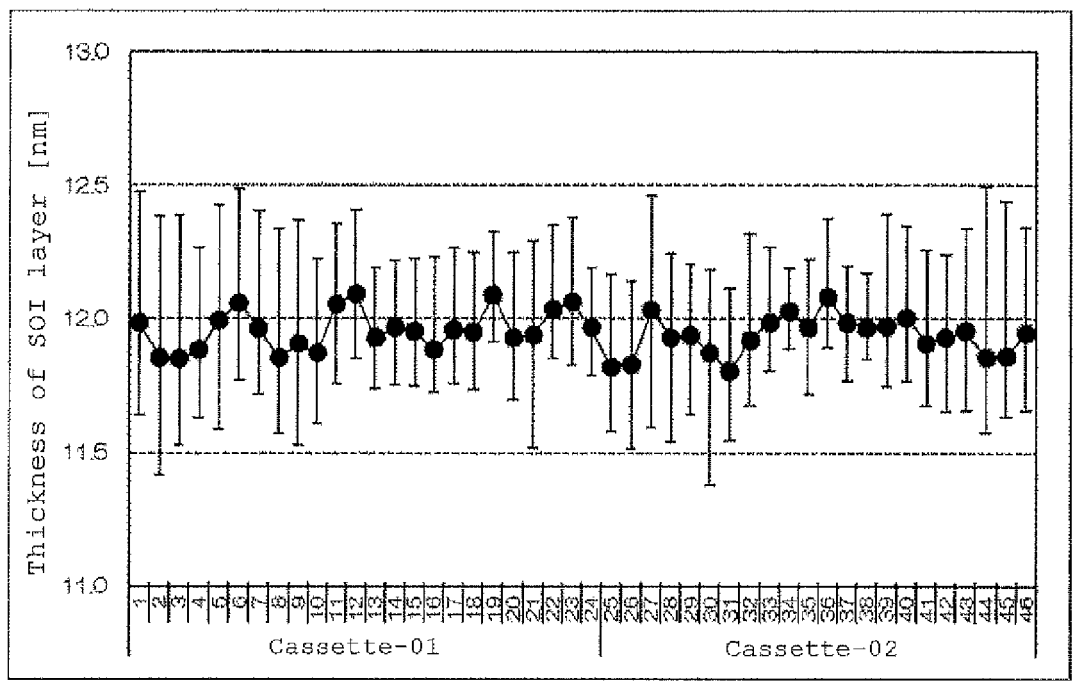
FIG. 3 is a diagram showing a relationship between a slot position in a cleaning cassette and a value of the thickness of the SOI layer in Example.
Figure 4:
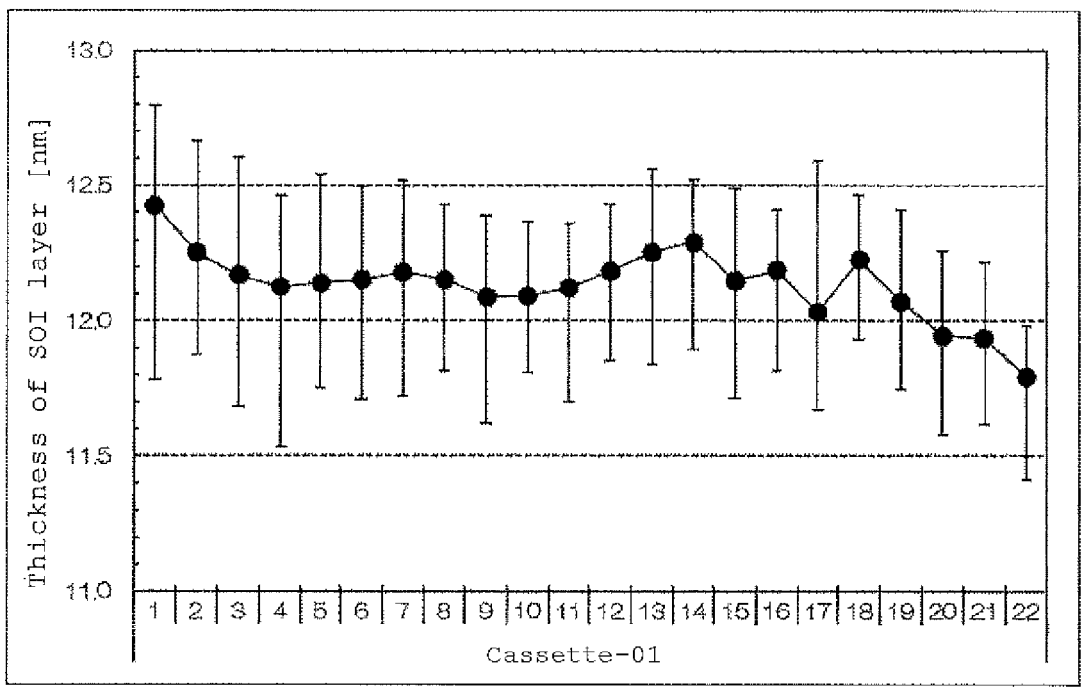
FIG. 4 is a diagram showing a relationship between a slot position in a cleaning cassette and a value of the thickness of the SOI layer in Comparative Example 1.
Figure 5:
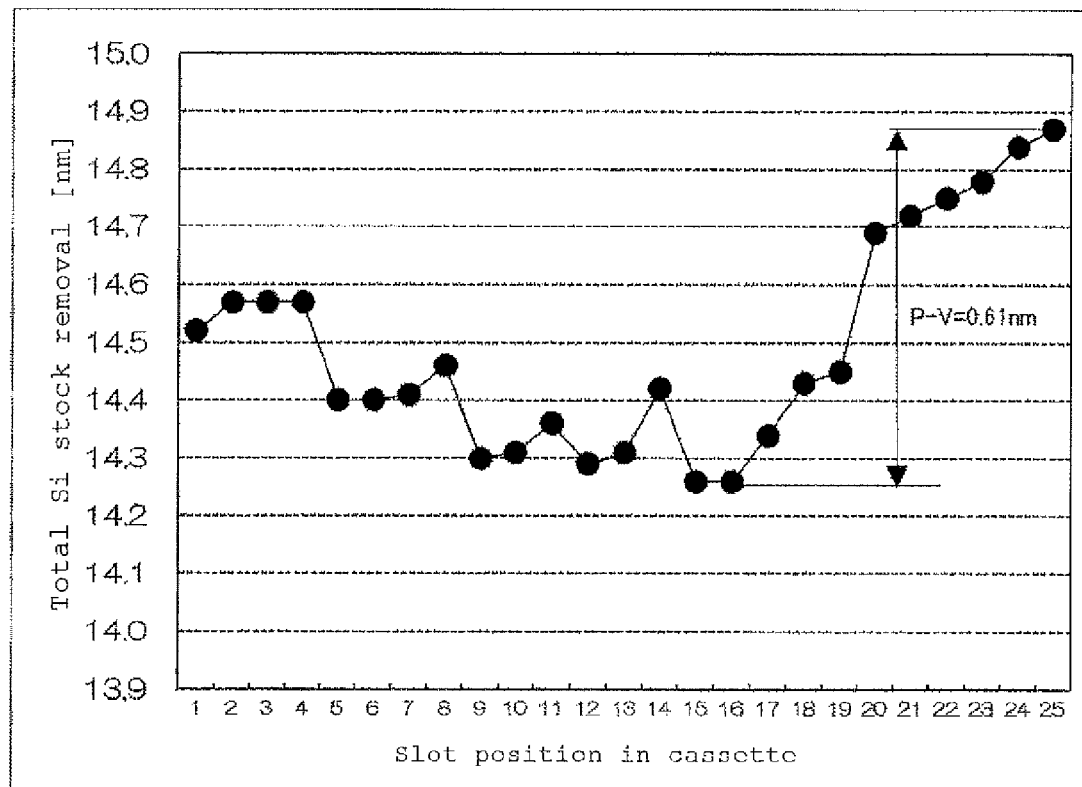
FIG. 5 is a diagram showing a relationship between a slot position in a cleaning cassette and an in-plane average stock removal of the SOI layer (Si) when the batch cleaning was performed.
Figure 6:
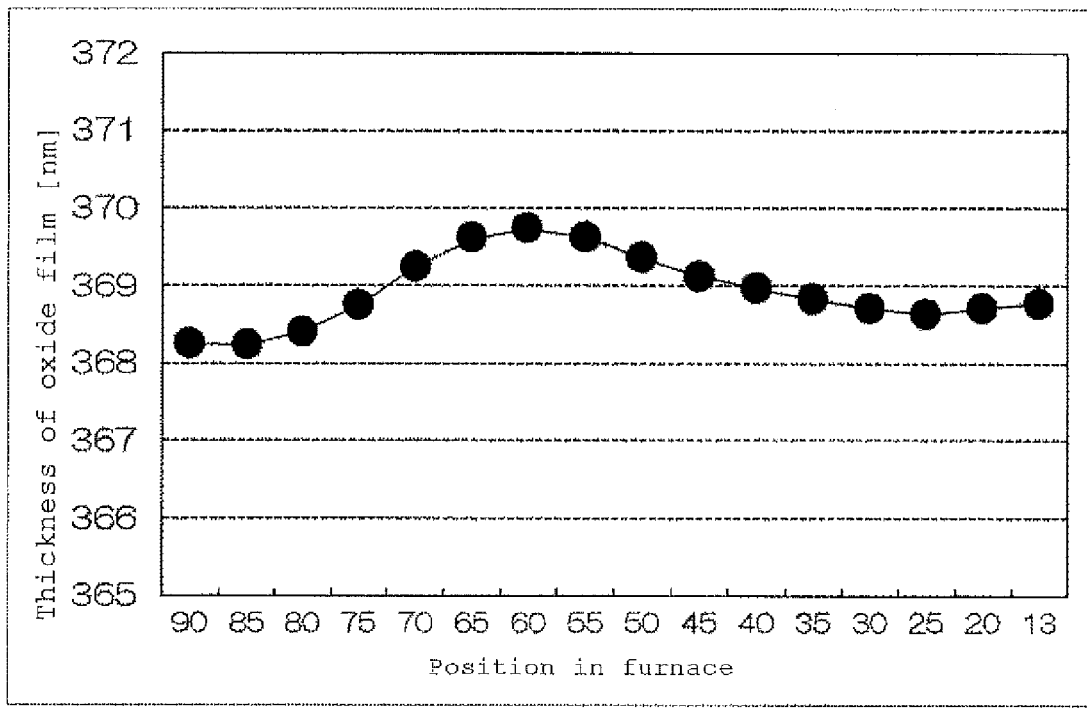
FIG. 6 is a diagram showing a relationship between a position in a furnace and (in-plane average) thickness of an oxide film formed when 100 SOI wafers were thermally oxidized with a batch heat treatment furnace in one batch.
Figure 7:
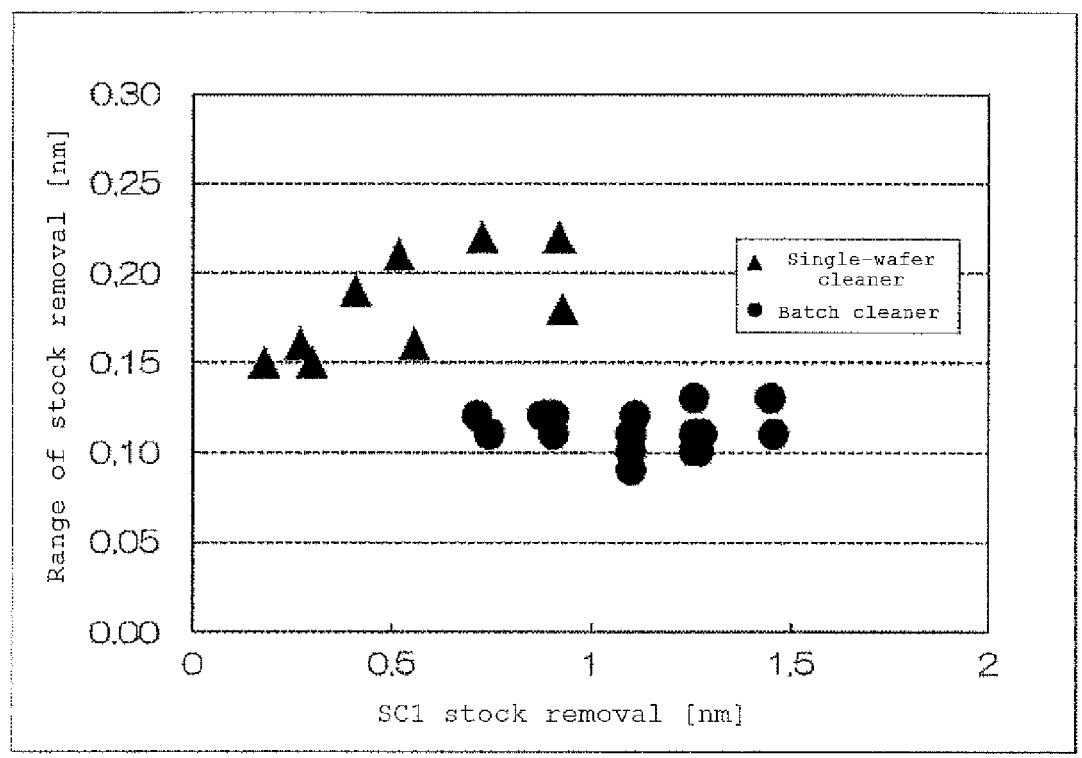
FIG. 7 is a diagram showing comparison results of in-plane average SC1 stock removal and in-plane stock removal range (P-V value) when multiple SOI wafers were cleaned with SC1 by the batch cleaning apparatus alone or the single-wafer cleaning apparatus alone.

Table 1 shows conditions of each step and measurement results in Example and Comparative Examples. The range in batch shown in Table 1 means variation (P-V value) of in-plane average film thickness of the wafers in a batch. FIG. 3 is a diagram showing a relationship between a slot position in the cleaning cassette and a value of the thickness of the SOI layer in Example. FIG. 4 is a diagram showing a relationship between a slot position in the cleaning cassette and a value of the thickness of the SOI layer in Comparative Example 1.

TABLE 1

|  | Comparative Example 1 | Comparative Example 2 | Example |
| --- | --- | --- | --- |
| SOI layer thickness before oxidation | SOI = 150 nm 22 wafers | SOI = 150 nm 22 wafers | SOI = 150 nm 46 wafers |
| Oxidation process | (Oxidation condition) 950° C., 2 hours, pyrogenic atmosphere | | |
| Oxide film/SOI film thickness measurement (ellipsometry) | Oxide film thickness = 300 nm, SOI = 16 nm (*SOI film thickness and oxide film thickness on surface can be simultaneously measured) | | |
| Batch thickness adjustment cleaning (HF cleaning + SC1 cleaning) | HF: 15%, 100 sec SC1: 180 sec | none | HF: 15%, 100 sec SC1: 140 sec |

TABLE 1-continued

|  | Comparative Example 1 | Comparative Example 2 | Example |
|---|---|---|---|
| SOI film thickness measurement (ellipsometry) | none | none | Average SOI film thickness in batch: 12.3 nm |
| Single-wafer thickness adjustment cleaning (SC1 cleaning by spin cleaning apparatus) | none | Cleaning was done after SiO$_2$ removal SC1: 160-200 sec | SC1: 20-60 sec |
| SOI film thickness Measurement (ellipsometry) | Batch average of SOI film thickness: 12.2 nm Range in batch: 0.7 nm Range in plane: 0.7 nm | Batch average of SOI film thickness: 12.2 nm Range in batch: 0.5 nm Range in plane: 1.2 nm | Batch average of SOI film thickness: 11.9 nm Range in batch: 0.5 nm Range in plane: 0.7 nm |
| 12 nm ± 0.5 nm pass rate | 59% (13 wafers passed) | 0% | 96% (44 wafers passed) |

As shown in Table 1 and FIG. 4, when the film thickness was adjusted only by the batch cleaning apparatus (Comparative Example 1), the batch average was slightly worse than Example, and the variation of film thickness in a batch could not be corrected. Consequently, the percentage of wafers having a film thickness beyond the target value±0.5 nm was significantly larger than Example.

In addition, as shown in Table 1, when the thickness was adjusted only by the single-wafer cleaning (Comparative Example 2), the batch average was slightly worse than Example, and the variation of film thickness in a plane was degraded. Consequently, all the wafers had a film thickness beyond the target value±0.5 nm.

By contrast, as shown in Table 1 and FIG. 3, Example, which combined the batch cleaning apparatus and the single-wafer cleaning apparatus, could precisely control the average value of each wafer to be the target value (12 nm) and control degradation of the variation of film thickness in a plane due to the single-wafer cleaning apparatus. Consequently, almost all the wafers (96%) satisfied the target value±0.5 nm.

It should be noted that the present invention is not limited to the above-described embodiments. The above-described embodiments are described for illustrative purposes, and those having substantially the same configuration and those providing the same operational advantage as the technical concept described in the claims of the present invention are all encompassed in the technical scope of the present invention.

The invention claimed is:

1. A method of manufacturing an SOI wafer, including reducing a thickness of an SOI layer formed on an insulator layer of an SOI wafer to a predetermined thickness such that the thickness of the SOI layer becomes a target value, the method comprising at least the steps of:
    (a) forming a thermal oxide film on the SOI layer by a heat treatment under an oxidizing gas atmosphere;
    (b) measuring the thickness of the SOI layer after forming the thermal oxide film;
    (c) performing batch cleaning which includes immersing the SOI layer in a cleaning solution having an etching property with respect to the SOI layer, wherein an etching amount of the SOI layer is adjusted depending on the thickness of the SOI layer measured in the step (b) such that the thickness of the SOI layer is adjusted to be thicker than the target value after etching by the batch cleaning;
    (d) measuring the thickness of the SOI layer after the batch cleaning; and
    (e) performing single-wafer cleaning which includes immersing the SOI layer in a cleaning solution having an etching property with respect to the SOI layer, wherein an etching amount of the SOI layer is adjusted depending on the thickness of the SOI layer measured in the step (d) such that the thickness of the SOI layer is adjusted to be the target value after etching by the single-wafer cleaning, the method further comprising removing the thermal oxide film formed in the step (a) after the step (a) and before the step (b), or after the step (b) and before the step (c).

2. The method of manufacturing an SOI wafer according to claim 1, wherein the thickness is measured in the step (b) without removing the thermal oxide film formed in the step (a), the thermal oxide film formed in the step (a) is removed by batch cleaning with a HF-containing aqueous solution after the step (b) and before the step (c), and the batch cleaning in the step (c) is performed by immersing the SOI layer in the cleaning solution having the etching property with respect to the SOI layer without drying a surface of the SOI layer after removing the thermal oxide film.

3. The method of manufacturing an SOI wafer according to claim 1, wherein the SOI wafer is produced by an ion implantation delamination method which includes at least the steps of: bonding a bond wafer having a micro bubble layer formed by implanting ions and a base wafer serving as a supporting substrate; and delaminating the bond wafer along the micro bubble layer to form a thin film on the base wafer.

4. The method of manufacturing an SOI wafer according to claim 2, wherein the SOI wafer is produced by an ion implantation delamination method which includes at least the steps of: bonding a bond wafer having a micro bubble layer formed by implanting ions and a base wafer serving as a supporting substrate; and delaminating the bond wafer along the micro bubble layer to form a thin film on the base wafer.

5. The method of manufacturing an SOI wafer according to claim 1, wherein the batch cleaning and the single-wafer cleaning include immersion in an SC1 solution.

6. The method of manufacturing an SOI wafer according to claim 2, wherein the batch cleaning and the single-wafer cleaning include immersion in an SC1 solution.

7. The method of manufacturing an SOI wafer according to claim 3, wherein the batch cleaning and the single-wafer cleaning include immersion in an SC1 solution.

8. The method of manufacturing an SOI wafer according to claim 4, wherein the batch cleaning and the single-wafer cleaning include immersion in an SC1 solution.

9. The method of manufacturing an SOI wafer according to claim 1, wherein a batch average of the thickness of the SOT layer after the batch cleaning in the step (c) is controlled to be a value between the target value and the target value+0.5 nm.

10. The method of manufacturing an SOI wafer according to claim 2, wherein a batch average of the thickness of the SOT layer after the batch cleaning in the step (c) is controlled to be a value between the target value and the target value+0.5 nm.

11. The method of manufacturing an SOI wafer according to claim 3, wherein a batch average of the thickness of the SOT layer after the batch cleaning in the step (c) is controlled to be a value between the target value and the target value+0.5 nm.

12. The method of manufacturing an SOI wafer according to claim 4, wherein a batch average of the thickness of the SOT layer after the batch cleaning in the step (c) is controlled to be a value between the target value and the target value+0.5 nm.

13. The method of manufacturing an SOI wafer according to claim 5, wherein a batch average of the thickness of the SOT layer after the batch cleaning in the step (c) is controlled to be a value between the target value and the target value+0.5 nm.

14. The method of manufacturing an SOI wafer according to claim 6, wherein a batch average of the thickness of the SOT layer after the batch cleaning in the step (c) is controlled to be a value between the target value and the target value+0.5 nm.

15. The method of manufacturing an SOI wafer according to claim 7, wherein a batch average of the thickness of the SOI layer after the batch cleaning in the step (c) is controlled to be a value between the target value and the target value+0.5 nm.

16. The method of manufacturing an SOI wafer according to claim 8, wherein a batch average of the thickness of the SOI layer after the batch cleaning in the step (c) is controlled to be a value between the target value and the target value+0.5 nm.

\* \* \* \* \*